(12) United States Patent
Schulz

(10) Patent No.: US 7,480,847 B2
(45) Date of Patent: Jan. 20, 2009

(54) ERROR CORRECTION CODE TRANSFORMATION TECHNIQUE

(75) Inventor: Jürgen M. Schulz, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 737 days.

(21) Appl. No.: 11/214,194

(22) Filed: Aug. 29, 2005

(65) Prior Publication Data
US 2007/0050695 A1    Mar. 1, 2007

(51) Int. Cl.
*H03M 13/00*   (2006.01)
(52) U.S. Cl. ................................ 714/774; 714/799
(58) Field of Classification Search ................ 714/774, 714/799
See application file for complete search history.

(56) References Cited

U.S. PATENT DOCUMENTS

| | | | | |
|---|---|---|---|---|
| 4,768,197 A * | 8/1988 | Petolino et al. ............. 714/754 |
| 5,247,523 A * | 9/1993 | Arai et al. ................... 714/755 |
| 5,392,299 A | 2/1995 | Rhines et al. |
| 5,537,421 A | 7/1996 | Dujari et al. |
| 5,583,786 A | 12/1996 | Needham |
| 5,684,944 A * | 11/1997 | Lubbers et al. ............... 714/6 |
| 5,740,186 A * | 4/1998 | Widmer ...................... 714/753 |
| 5,757,825 A * | 5/1998 | Kimura et al. ............... 714/758 |
| 5,784,387 A * | 7/1998 | Widmer ...................... 714/752 |
| 5,848,076 A * | 12/1998 | Yoshimura .................. 714/763 |
| 5,949,796 A | 9/1999 | Kumar |
| 5,991,911 A * | 11/1999 | Zook ......................... 714/758 |
| 6,029,264 A | 2/2000 | Kobayashi et al. |
| 6,263,466 B1 | 7/2001 | Hinedi et al. |
| 6,320,852 B1 | 11/2001 | Obuchi et al. |
| 6,477,669 B1 * | 11/2002 | Agarwal et al. ............. 714/708 |
| 6,581,178 B1 * | 6/2003 | Kondo ......................... 714/758 |
| 6,604,217 B1 * | 8/2003 | Kahlman ..................... 714/752 |
| 6,745,359 B2 | 6/2004 | Nadeau-Dostie |
| 6,751,321 B1 | 6/2004 | Kato et al. |
| 6,886,121 B2 | 4/2005 | Dervisoglu et al. |
| 6,901,546 B2 | 5/2005 | Chu et al. |
| 7,155,657 B2 * | 12/2006 | Bordes et al. ............... 714/774 |
| 7,328,365 B2 * | 2/2008 | Karpuszka et al. .......... 714/773 |
| 2004/0133831 A1 | 7/2004 | Williams et al. |
| 2004/0133832 A1 | 7/2004 | Williams et al. |
| 2004/0133836 A1 | 7/2004 | Williams |

FOREIGN PATENT DOCUMENTS

WO    WO 01/25924 A1    4/2001

OTHER PUBLICATIONS

Anshuman Chandra, "System-on-a-Chip Test-Data Compression and Decompression Architectures Based on Golomb Codes," IEEE, 2001, pp. 355-368.
Stephen B. Wicker, "Error Control Systems for Digital Communications," Prentice-Hall, 1996, pp. 116-121.

* cited by examiner

*Primary Examiner*—Mujtaba K Chaudry
(74) *Attorney, Agent, or Firm*—Lawrence J. Merkel; Meyertons, Hood, Kivlin, Kowert & Goetzel, P.C.

(57) ABSTRACT

In one embodiment, a system comprises a source configured to provide data and a source error correction code (ECC) generated according to a source ECC scheme; a circuit comprising an ECC transform unit configured to generate a target ECC from the data, detect an error in the data responsive to the source ECC, and correct the error in the data, wherein the target ECC is generated according to a target ECC scheme different from the source ECC scheme, and wherein the ECC transform unit is configured to continuously protect the data with at least one of the source ECC and the target ECC; and a target coupled to receive the data and the target ECC from the circuit.

20 Claims, 3 Drawing Sheets

ERROR CORRECTION CODE TRANSFORMATION TECHNIQUE

BACKGROUND

1. Field of the Invention

This invention is related to the field of error correction codes (ECC).

2. Description of the Related Art

Various types of ECC schemes have been implemented in systems. For example, memory systems composed of random access memory (RAM) such as static RAM (SRAM), dynamic RAM (DRAM), etc. often implement ECC. In the memory system, storage is provided for the ECC-protected data and additional storage is provided for the ECC data. The ECC protects against errors that may be induced by failures in the memory, soft errors due to Alpha or Cosmic ray hits, etc.

In some systems, various interconnect may also be provided with ECC protection. Often, the ECC scheme used on the interconnect differs from the ECC scheme used in the memory. For example, the ECC scheme used in the memory typically generates each bit of ECC for a code word of data as a logical combination (e.g. exclusive OR, or XOR) of bits that are each stored in different memory chips, or modules, or banks, etc. In such a scheme, the failure of one chip, module, or bank may be detected and possibly corrected in addition to the possibility of detecting and correcting soft errors. The ECC scheme used on the interconnect may be as simple as parity, or may be an XOR scheme in which each ECC bit is generated from bits transmitted on different physical conductors or bits on the same conductor transmitted at different times. Furthermore, the ECC scheme used on one interconnect in a system may differ from the ECC scheme used on another interconnect in the same system.

Circuitry that bridges different ECC schemes, such as a memory controller or circuitry coupled to two interconnects having different ECC schemes, typically check that received data is error-free (using the ECC scheme corresponding to the transmitter of the data) and correct the received data, if needed. Prior to transmitting data to a receiver, the ECC is generated using the ECC scheme of the receiver to which the data is being transmitted.

Between the checking/correction of received data and generating ECC for transmitting data, the data is unprotected. As semiconductor manufacturing technologies have continued to decrease feature sizes, such as to 90 nanometer and below, the sensitivity of various storage devices such as flops to soft errors has begun to approach that of RAM memories. Accordingly, the rate of silent data corruption in flops and other such storage devices has been increasing to levels that are unacceptable for reliable system operation.

SUMMARY

In one embodiment, a system comprises a source coupled to a circuit which is further coupled to a target. The source is configured to provide data and a source error correction code (ECC) generated according to a source ECC scheme. Coupled to receive the data and the source ECC, a circuit comprises an ECC transform unit configured to generate a target ECC from the data, detect an error in the data responsive to the source ECC, and correct the error in the data. The target ECC is generated according to a target ECC scheme different from the source ECC scheme. The ECC transform unit is configured to continuously protect the data with at least one of the source ECC and the target ECC. The target is coupled to receive the data and the target ECC from the circuit. In various embodiments, the source or target may be memory, and interconnect, or other sources/targets.

In another embodiment, an ECC transform unit comprises an error code generator (ECG), an error detection and correction (EDC) unit, and an ECC modification circuit coupled to the EDC unit. The ECG is coupled to receive data and configured to generate a first ECC from the data according to a first ECC scheme. Coupled to receive the data and a second ECC transmitted to the ECC transform unit with the data, the EDC unit is configured to detect an error in the data responsive to the data and the second ECC. The second ECC is generated according to a second ECC scheme different from the first ECC scheme. The ECC modification circuit is coupled to receive the first ECC and is configured to modify the first ECC if the EDC unit detect the error in the data. In still another embodiment, a method comprises receiving data and a source error correction code (ECC) generated according to a source ECC scheme; generating a target ECC responsive to the data according to a target ECC scheme; detecting an error in the data responsive to the data and the source ECC; and modifying the target ECC to account for the error.

BRIEF DESCRIPTION OF THE DRAWINGS

The following detailed description makes reference to the accompanying drawings, which are now briefly described.

Figure 1:
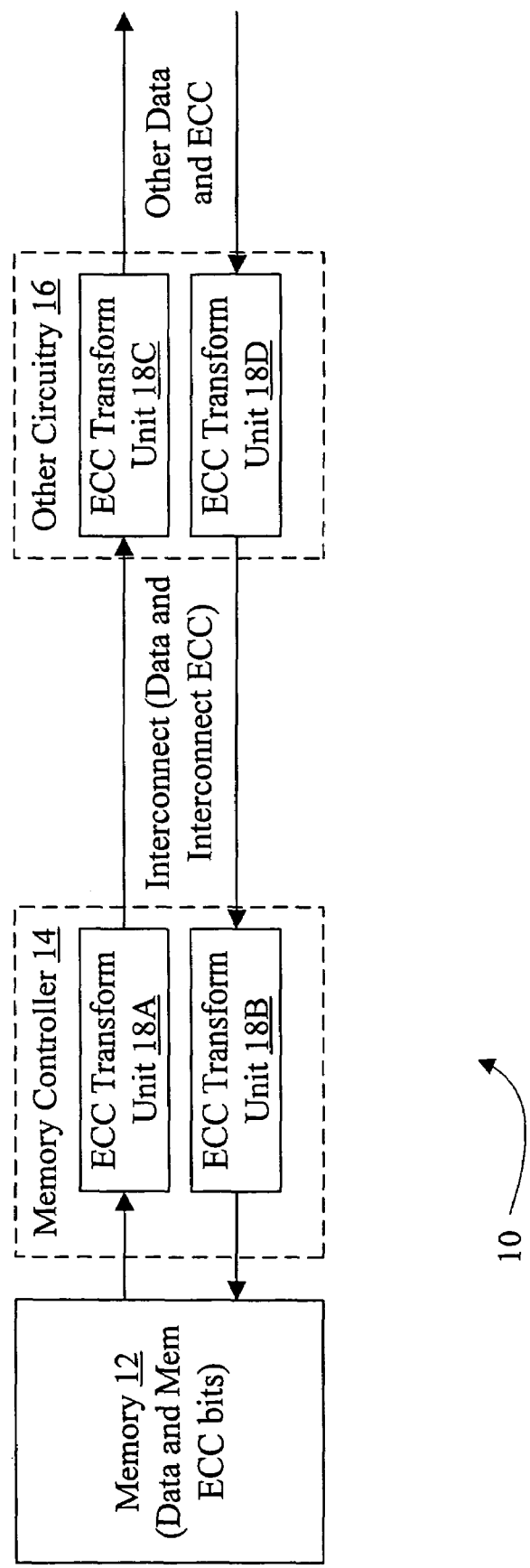
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of a system 10 is shown. In the illustrated embodiment, the system 10 includes a memory 12, a memory controller 14 coupled to the memory 12, and other circuitry 16 coupled to the memory controller 14. The circuitry 16 may comprise, e.g., one or more processors, one or more bridges to peripheral interconnects, and/or fixed function circuitry, etc.

In the illustrated embodiment, the system 10 includes multiple ECC transform units 18 (e.g. ECC transform units 18A-18B in the memory controller 14 and ECC transform units 18C-18D in the circuitry 16). Generally, an ECC transform unit may comprise circuitry configured to receive data from a source with a source ECC that is generated according to the source ECC scheme and to transmit the data to a target with a target ECC that was generated according to a target ECC scheme. The target ECC scheme may be different than the source ECC scheme.

More particularly, the ECC transform units 18 may generate target ECC and check (and possibly correct) the data with source ECC to ensure that the data remains continuously ECC protected. That is, each time the data is stored into a clocked storage device, at least one of the source ECC and the target ECC is retained and is protecting the data from corruption. In some embodiments, silent data corruption may be prevented since the data is continuously ECC protected. Silent data corruption while the data is stored in the storage device may be prevented. Additionally, data corruption that may occur due to soft errors in combinatorial logic may also be prevented. Alpha/Cosmic ray hits on some combinatorial logic circuits may change the delay of the circuits and thus may lead to corruption at the next storage device even though the storage device itself may be operating properly.

For example, in the system 10, the memory 12 may store data and may also store ECC bits generated over the data according to a memory ECC scheme. Data read from the memory 12 by the memory controller 14 (and corresponding memory ECC bits) are received by the memory controller 14 (and more particularly the ECC transform unit 18A). The ECC transform unit 18A may check (and possibly correct) the data with the memory ECC and may also generate ECC according to the ECC scheme used on the interconnect between the memory controller 14 and the circuitry 16. The data and the interconnect ECC may be transmitted to the circuitry 16.

Similarly, the circuitry 16 may transmit data to the memory controller 14 to be written to the memory 12, protected by the interconnect ECC during transmission. The memory controller 14 (and more particularly the ECC transform unit 18B) receives the data and interconnect ECC. The ECC transform unit 18B may check (and possibly correct) the data with the interconnect ECC and may also generate the memory ECC for the data. The data and the memory ECC may the be written to the memory 12.

The ECC transform units 18C-18D may operate in a similar fashion with respect to the data and the interconnect ECC, and the data and other ECC different from the interconnect ECC, as illustrated in FIG. 1.

Generally, an ECC scheme may refer to the definition of how the ECC is generated over the protected data and how the ECC is used to detect (and possibly correct) errors in the protected data. The ECC may comprise one or more bits, defined in any desired fashion which provides for both the detection of at least some errors that may occur in the data and correction of at least some of the detected errors. For example, the ECC may comprise parity, multi-bit ECC in which each bit is generated over different (but possibly overlapping) sets of data bits, etc. ECC schemes may include single error correct/double error detect (SECDED), for example, or detection of any number of concurrent bit errors and correction of any number of concurrent bit errors. ECC schemes may also include chip kill schemes (which are designed to detect a failing memory chip and correct for errors in the failing memory chip), module-kill schemes (which are designed to detect a failing memory module and correct errors in the failing memory module), combinations of the chip-kill or module-kill schemes with bit-error detection schemes, etc.

The memory 12 may comprise any type of memory (e.g. SRAM, DRAM, double data rate (DDR) DRAM, DDR2 DRAM, Rambus DRAM, etc.). The memory may be arranged into memory modules such as single inline memory modules (SIMs) or dual inline memory modules (DIMMs). The memory chips or modules may be banked, if desired. The memory controller 14 comprises circuitry configured to read or write the memory 12 in response to read/write commands for circuitry 16.

The interconnect between the memory controller 14 and the circuitry 16 (and between the circuitry 16 and the other circuitry, not shown in FIG. 1) may comprise any communication medium. For example, the interconnect may comprise unidirectional point-to-point links for communicating in each direction. Alternatively, the interconnect may comprise a bidirectional or multidrop bus. The interconnect may also comprise wireless communication.

It is noted that various embodiments of the system 10 may include any number of memory controllers 14 coupled to memories 12 and any number of instances of circuitry 16 (of various types, if desired). In some embodiments, the memory controller 14 and the circuitry 16 may comprise separate integrated circuit chips. In other embodiments, the memory controller 14 and the circuitry 16 may be integrated onto the same chip.

Figure 2:
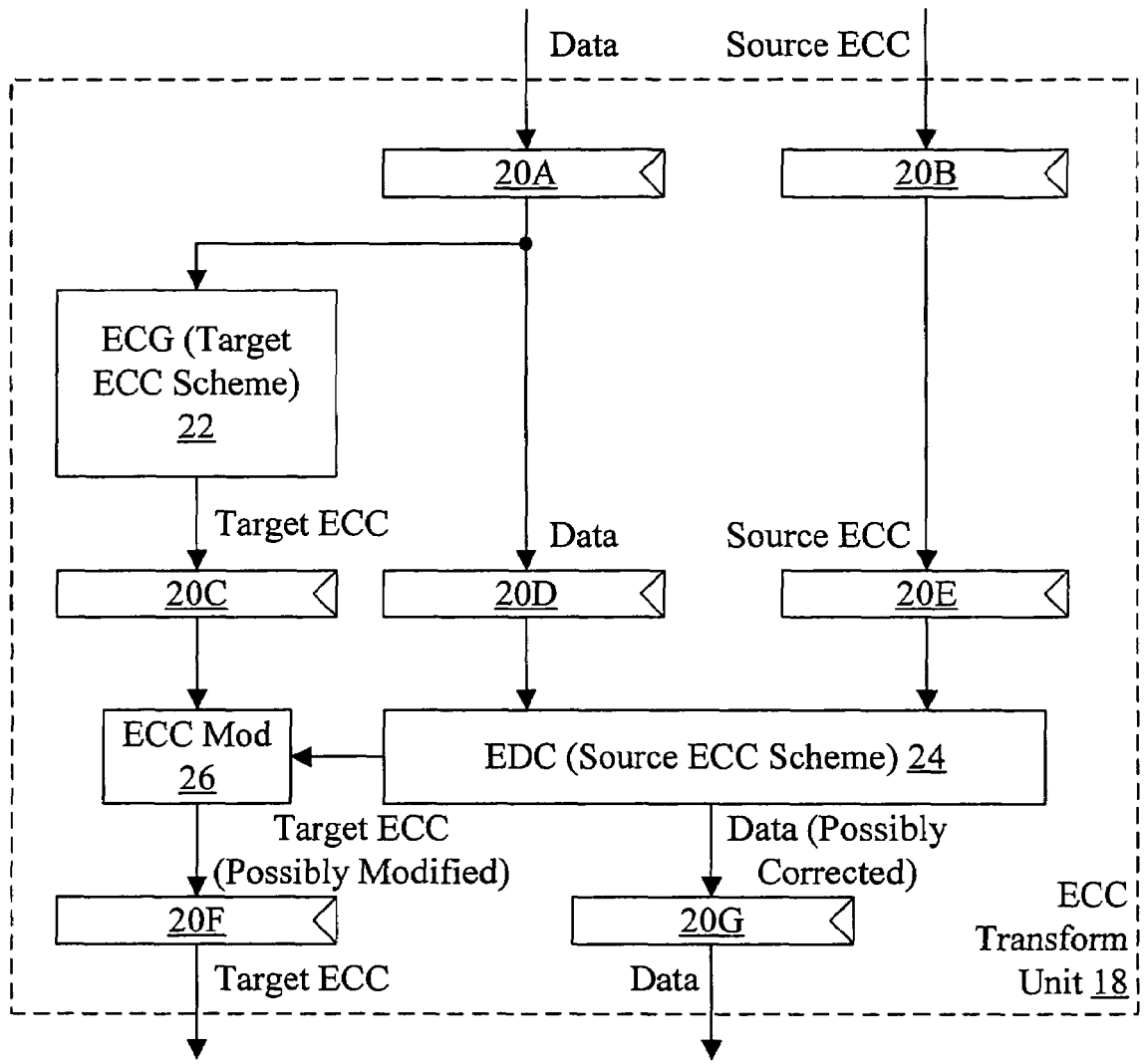
FIG. 2 is a block diagram of one embodiment of an ECC transform unit shown in FIG. 1.

Turning now to FIG. 2, a block diagram of one embodiment of an ECC transform unit 18 is shown. The ECC transform units 18A-18D in FIG. 1 may each be instances of the ECC transform unit 18 shown in FIG. 2. In the embodiment of FIG. 2, the ECC transform unit 18 includes a set of clocked storage devices 20A-20G. Any type of clocked storage device may be used. A clocked storage device may generally include any device which captures data on an input, stores the data, and propagates the data on an output under the control of at least a clock signal (although other control signals, like a hold signal, may also be used). For example, clocked storage devices may include flops, latches, registers, etc. Other types of storage devices may not be explicitly clocked (e.g. self-timed, asynchronous logic storage devices). The storage devices 20A-20G will be referred to in this description as flops, but any other type of clocked or non-clocked storage device may be used. The flop 20A is coupled to receive data from the source, and the flop 20B is coupled to concurrently receive the source ECC for the data. The output of the flop 20A is coupled to the input of the flop 20D, and also to an error correction code generator (ECG) 22. The output of the ECG 22 is coupled to the flop 20C. The output of the flop 20B is coupled to the flop 20E. The outputs of the flops 20D-20E are coupled to an error detection and correction (EDC) unit 24, which is coupled to an ECC modifier circuit 26 and coupled to output the data, possibly corrected, to the flop 20G. The ECC modifier circuit 26 is coupled to receive the target ECC from the flop 20C, and is configured to output the target ECC, possibly modified, to the flop 20F. The data and target ECC is transmitted from the flops 20F-20G as outputs of the ECC transform unit 18.

In the illustrated embodiment, the data and source ECC are received into the flops 20A-20B. The ECG 22 generates the target ECC according to the target ECC scheme. The data is stored into the flop 20D, and is protected by the target ECC at this point (as well as remaining protected by the source ECC in the flop 20E). However, the data may have been corrupted in the flop 20A (or prior to arriving in the flop 20A), and thus the target ECC generated from the data (with the error) is not correct for the correct data. At that point, the source ECC was still protecting the data. Accordingly, the EDC 24 may use the source ECC to check the data (and possibly correct the data if a correctable error is detected in the source ECC). The data, corrected for any detected correctable errors, is provided by the EDC 24 to the flop 20G. Additionally, the EDC 24 may signal the ECC modifier circuit 26 that a correctable error was detected. The EDC 24 may also indicate which bit was in error. Responsive to the signalling from the EDC 24, the ECC modifier circuit 26 may modify the target ECC received from the flop 20C to correct the target ECC for the error. Thus, the target ECC provided to the flop 20F may properly represent the corrected data in the flop 20G, in the case of a correctable error in the data.

The modification applied by the ECC modifier circuit 26 depends on the definition of the target ECC scheme. For example, if the target ECC scheme defines ECC bits that are generated over sets of data bits, the ECC bits that depend on an errant data bit may be inverted.

It is noted that, in the present embodiment, the target ECC is generated prior to the checking/correction of the data using the source ECC. In other embodiments, the target ECC generation and the source ECC checking/correction may be performed in parallel (e.g. the EDC 24 may operate in parallel with the ECG 22). There may be an additional check/correct before transmission using the target ECC scheme, in some such embodiments. It is further noted that, in some embodiments, the data may be manipulated within the ECC transform unit 18, in addition to correcting errors identified by the ECC codes.

The flops 20A-20B are provided to capture the data and source ECC, assuming that the data and source ECC arrive too late to permit operation of the ECG 22 directly on the received data. If the data arrives early enough to permit such operation by the ECG 22, the flops 20A-20B may be eliminated and the flops 20D-20E may receive the data and source ECC. Similarly, the flops 20F-20G are provided to ensure enough transmit time to the target after operation of the EDC 24 and the ECC modifier circuit 26. In embodiments in which enough transmit time is available within the same clock cycle as operation of the EDC 24 and the ECC modifier circuit 26, the flops 20F-20G may be eliminated.

As mentioned above, each of the ECC transform units 18A-18D may be instances of the ECC transform unit 18 shown in FIG. 2. For example, in the ECC transform unit 18A instance, the memory 12 may be the source and the interconnect to the circuitry 16 (and its interconnect ECC definition) may be the target. In the ECC transform unit 18B instance, the interconnect is the source and the memory 12 is the target. In the ECC transform unit 18C instance, the interconnect from the memory controller 14 is the source and the other interconnect is the target. In the ECC transform unit 18D instance, the other interconnect is the source and the interconnect to the memory controller 14 is the target.

Figure 3:
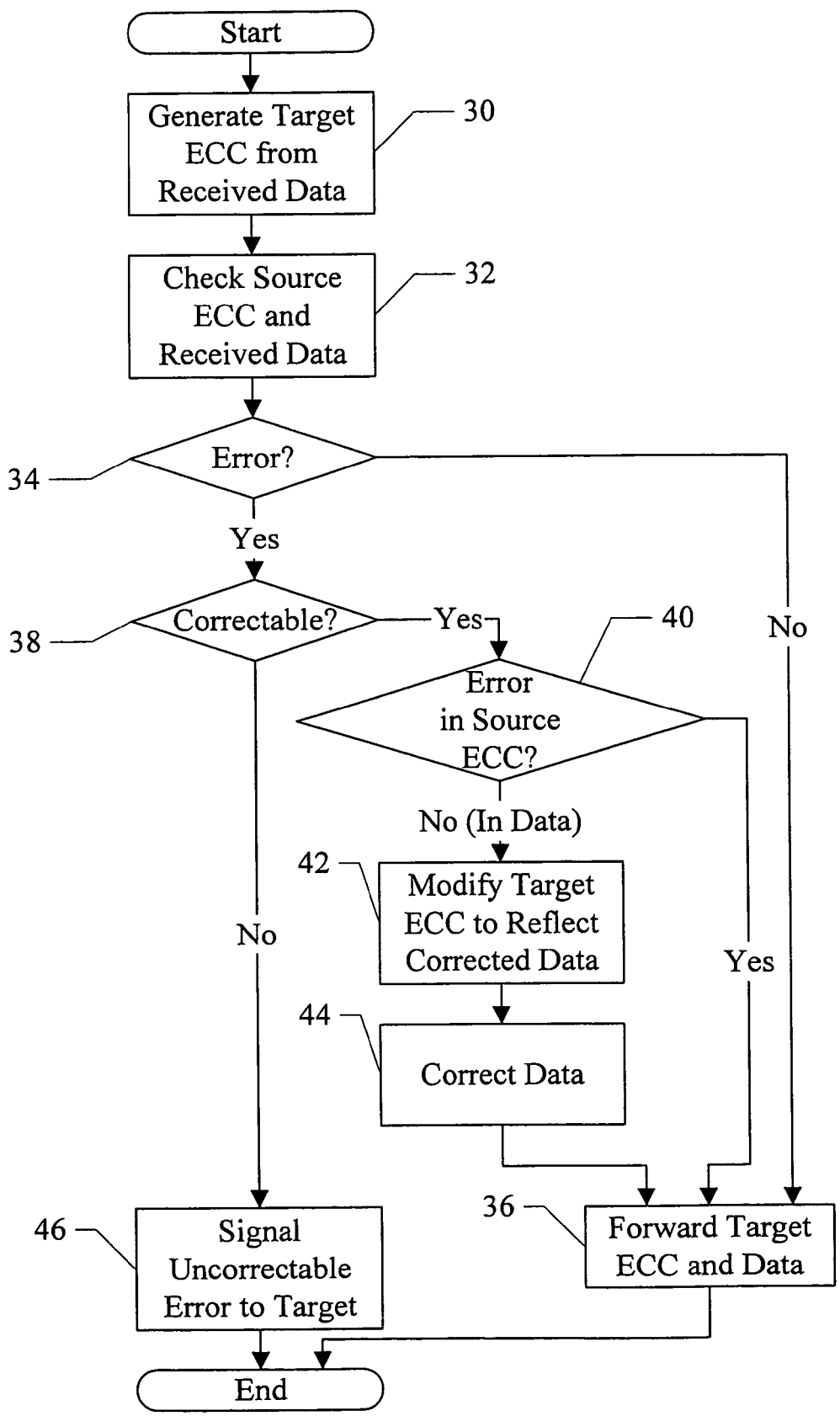
FIG. 3 is a flowchart illustrating operation of one embodiment of an ECC transform unit.

Turning now to FIG. 3, a flowchart is shown illustrating operation of one embodiment of the ECC transform unit 18. While the blocks are shown in a particular order in FIG. 3 for ease of understanding, other orders may be used. Blocks may be performed in parallel in combinatorial logic in the ECC transform unit 18. Blocks, combinations of blocks, and/or the flowchart as a whole may be pipelined over multiple clock cycles (e.g. the embodiment of FIG. 2).

The ECC transform unit 18, and more particularly the ECG 22 in the embodiment of FIG. 2, may generate the target ECC from the received data according to the target ECC scheme (block 30). The ECC transform unit 18, and more particularly the EDC unit 24 in the embodiment of FIG. 2, may check the source ECC and the received data (block 32). If an error is not detected (decision block 34, "no" leg), the ECC transform unit 18 may forward the target ECC and the data to the target (block 36). If an error is detected (decision block 34, "yes" leg), and the error is correctable (decision block 38, "yes" leg), the error may either be in the source ECC or in the data. If the error is in the source ECC (decision block 40, "yes" leg), then no correction of the data is needed. The ECC transform unit 18 may thus forward the target ECC and the data to the target (block 36). On the other hand, if the error is in the data (decision block 40, "no" leg), the ECC transform unit 18, and more particularly the ECC modifier circuit 26 in the embodiment of FIG. 2, may modify the target ECC (generated as mentioned above with regard to block 30) to reflect the correction in the data (block 42). Additionally, the ECC transform unit 18, and more particularly the EDC unit 24 in the embodiment of FIG. 2, may correct the error in the data (block 44). The ECC transform unit 18 may forward the corrected data and modified target ECC (block 36).

In some embodiments, the source ECC scheme may detect errors that are not correctable. For example, the SECDED scheme detects double bit errors but cannot correct them. If an uncorrectable error is detected (decision block 38, "no" leg), the ECC transform unit 18 may signal uncorrectable error to the target (block 46). The uncorrected data may also be transmitted, in some embodiments, to complete the transfer. In addition to signalling an uncorrectable error (or in the alternative), the ECC modifier circuit 26 may modify the target ECC so that, if the data is checked with the target ECC, an uncorrectable error is detected.

Numerous variations and modifications will become apparent to those skilled in the art once the above disclosure is fully appreciated. It is intended that the following claims be interpreted to embrace all such variations and modifications.

What is claimed is:

1. An error correction code (ECC) transform unit comprising:
   an error code generator (ECG) coupled to receive data and configured to generate a first ECC from the data according to a first ECC scheme;
   an error detection and correction (EDC) unit coupled to receive the data and a second ECC transmitted to the ECC transform unit with the data, wherein the EDC unit is configured to detect an error in the data responsive to the data and the second ECC, and wherein the second ECC is generated according to a second ECC scheme different from the first ECC scheme; and
   an ECC modification circuit coupled to receive the first ECC and coupled to the EDC unit, wherein the ECC modification circuit is configured to modify the first ECC if the EDC unit detect the error in the data.

2. The ECC transform unit as recited in claim 1 wherein the EDC unit is further configured to correct the error in the data.

3. The ECC transform unit as recited in claim 2 configured to transmit the corrected data and the modified first ECC.

4. The ECC transform unit as recited in claim 1 wherein the EDC unit is configured to detect an error in the second ECC, and wherein the ECC modification circuit does not modify the first ECC if the error is detected in the second ECC.

5. The ECC transform unit as recited in claim 1 wherein the EDC unit is configured to detect an uncorrectable error in the data, and wherein the ECC transform unit is configured to transmit an indication of the uncorrectable error.

6. The ECC transform unit as recited in claim 1 further comprising a first storage device coupled to receive the data, a second storage device coupled to concurrently receive the second ECC, and a third storage device coupled to concurrently receive the first ECC.

7. The ECC transform unit as recited in claim 6 wherein the EDC unit is coupled to the output of the first storage device to receive the data and to the output of the second storage device to receive the second ECC.

8. The ECC transform unit as recited in claim 7 wherein the ECC modification circuit is coupled to the output of the third storage device to receive the first ECC.

9. A system comprising:
   a source configured to provide data and a source error correction code (ECC) generated according to a source ECC scheme;
   a circuit coupled to receive the data and the source ECC, the circuit comprising an ECC transform unit configured to generate a target ECC from the data, detect an error in the data responsive to the source ECC, and correct the error in the data, wherein the target ECC is generated according to a target ECC scheme different from the source ECC scheme, and wherein the ECC transform unit is configured to continuously protect the data with at least one of the source ECC and the target ECC; and a target coupled to receive the data and the target ECC from the circuit.

10. The system as recited in claim 9 wherein the circuit is a memory controller.

11. The system as recited in claim 10 wherein the source is a memory and the target is an interconnect.

12. The system as recited in claim 10 wherein the source is an interconnect and the target is a memory.

13. The system as recited in claim 9 wherein the source is a first interconnect and the target is a second interconnect.

14. The system as recited in claim 9 wherein the ECC transform unit is configured to modify the generated target ECC to account for the error, and transmit the modified target ECC as the target ECC received by the target.

15. The system as recited in claim 14 wherein the ECC transform unit is configured to detect an error in the second ECC, and wherein the ECC transform unit does not modify the first ECC if the error is detected in the second ECC.

16. A method comprising:
  receiving data and a source error correction code (ECC) generated according to a source ECC scheme;
  generating a target ECC responsive to the data according to a target ECC scheme;
  detecting an error in the data responsive to the data and the source ECC; and
  modifying the target ECC to account for the error.

17. The method as recited in claim 16 wherein the generating is performed prior to the detecting.

18. The method as recited in claim 16 further comprising correcting the error in the data.

19. The method as recited in claim 18 further comprising transmitting the corrected data and the modified target ECC.

20. The method as recited in claim 16 further comprising:
  detecting an uncorrectable error in the data; and
  forwarding an indication of the uncorrectable error.

* * * * *